United States Patent
Moloudi

(10) Patent No.: US 7,933,555 B2
(45) Date of Patent: Apr. 26, 2011

(54) SYSTEM AND METHOD FOR REDUCING PHASE NOISE

(75) Inventor: Shervin Moloudi, Los Angeles, CA (US)

(73) Assignee: Broadcom Corporation

( * ) Notice: Subject to any disclaimer, the term of this patent is extended or adjusted under 35 U.S.C. 154(b) by 974 days.

(21) Appl. No.: 10/813,486

(22) Filed: Mar. 30, 2004

(65) Prior Publication Data

US 2004/0185781 A1 Sep. 23, 2004

Related U.S. Application Data

(63) Continuation-in-part of application No. 09/634,552, filed on Aug. 8, 2000.

(60) Provisional application No. 60/160,806, filed on Oct. 21, 1999, provisional application No. 60/163,487, filed on Nov. 4, 1999, provisional application No. 60/163,398, filed on Nov. 4, 1999, provisional application No. 60/164,442, filed on Nov. 9, 1999, provisional application No. 60/164,194, filed on Nov. 9, 1999, provisional application No. 60/164,314, filed on Nov. 9, 1999, provisional application No. 60/165,234, filed on Nov. 11, 1999, provisional application No. 60/165,239, filed on Nov. 11, 1999, provisional application No. 60/165,356, filed on Nov. 12, 1999, provisional application No. 60/165,355, filed on Nov. 12, 1999, provisional application No. 60/172,348, filed on Dec. 16, 1999, provisional application No. 60/201,335, filed on May 2, 2000, provisional application No. 60/201,157, filed on May 2, 2000, provisional application No. 60/201,179, filed on May 2, 2000, provisional application No. 60/202,997, filed on May 10, 2000, provisional application No. 60/201,330, filed on May 2, 2000.

(51) Int. Cl.
*H04B 1/00* (2006.01)
(52) U.S. Cl. ............... 455/63.1; 455/139; 455/114.3
(58) Field of Classification Search .............. 455/139, 455/63.1, 20, 114.1, 39, 317, 137, 138, 114.2, 455/114.3
See application file for complete search history.

(56) References Cited

U.S. PATENT DOCUMENTS

| | | | | |
|---|---|---|---|---|
| 3,742,149 A * | 6/1973 | Yoshida et al. | ............. | 370/201 |
| 4,161,694 A * | 7/1979 | Weber et al. | ............. | 370/315 |
| 4,768,187 A * | 8/1988 | Marshall | ............. | 370/343 |
| 4,811,021 A * | 3/1989 | Yoshimoto et al. | ............. | 342/361 |
| 4,812,849 A * | 3/1989 | Otto | ............. | 342/194 |
| 4,868,810 A * | 9/1989 | Vary et al. | ............. | 370/339 |
| 4,994,767 A * | 2/1991 | Hawkes | ............. | 332/123 |
| 4,999,596 A * | 3/1991 | Nakatani et al. | ............. | 333/204 |
| 5,033,110 A * | 7/1991 | Harman | ............. | 455/114.1 |
| 5,123,008 A * | 6/1992 | Beesley | ............. | 370/280 |
| 5,179,728 A * | 1/1993 | Sowadski | ............. | 455/183.1 |
| 5,208,804 A * | 5/1993 | Wilson et al. | ............. | 370/343 |
| 5,347,229 A * | 9/1994 | Suckling et al. | ............. | 330/251 |
| 5,661,439 A * | 8/1997 | Watkins et al. | ............. | 331/1 R |

(Continued)

*Primary Examiner* — Nhan Le
(74) *Attorney, Agent, or Firm* — McAndrews, Held & Malloy, Ltd.

(57) ABSTRACT

Systems and methods that reduce phase noise are provided. In one embodiment, a method may include one or more of the following: generating a signal at a particular frequency in which the signal may be associated with a harmonic frequency signal disposed at a harmonic frequency; and selectively attenuating frequency content disposed in a region around the harmonic frequency. The signal may be associated with a second harmonic frequency signal disposed at a second harmonic frequency. Frequency content disposed in a second region around the second harmonic frequency may be selectively attenuated. One or more non-linear operations may be applied to the signal and the applied signal may be transmitted.

38 Claims, 14 Drawing Sheets

U.S. PATENT DOCUMENTS

| | | | |
|---|---|---|---|
| 5,794,131 A * | 8/1998 | Cairns | 455/76 |
| 5,796,850 A * | 8/1998 | Shiono et al. | 381/94.1 |
| 6,026,287 A * | 2/2000 | Puechberty et al. | 455/333 |
| 6,064,277 A * | 5/2000 | Gilbert | 331/117 R |
| 6,201,785 B1 * | 3/2001 | Fouche et al. | 370/203 |
| 6,204,810 B1 * | 3/2001 | Smith | 342/365 |
| 6,271,790 B2 * | 8/2001 | Smith | 342/365 |
| 6,298,244 B1 * | 10/2001 | Boesch et al. | 455/553.1 |
| 6,333,679 B1 * | 12/2001 | Eriksson | 331/25 |
| 6,522,868 B1 * | 2/2003 | Stilwell | 455/76 |
| 6,542,724 B1 * | 4/2003 | Copeland et al. | 455/302 |
| 2002/0119759 A1 * | 8/2002 | Hahn | 455/77 |
| 2004/0209589 A1 * | 10/2004 | Dorning | 455/317 |

* cited by examiner

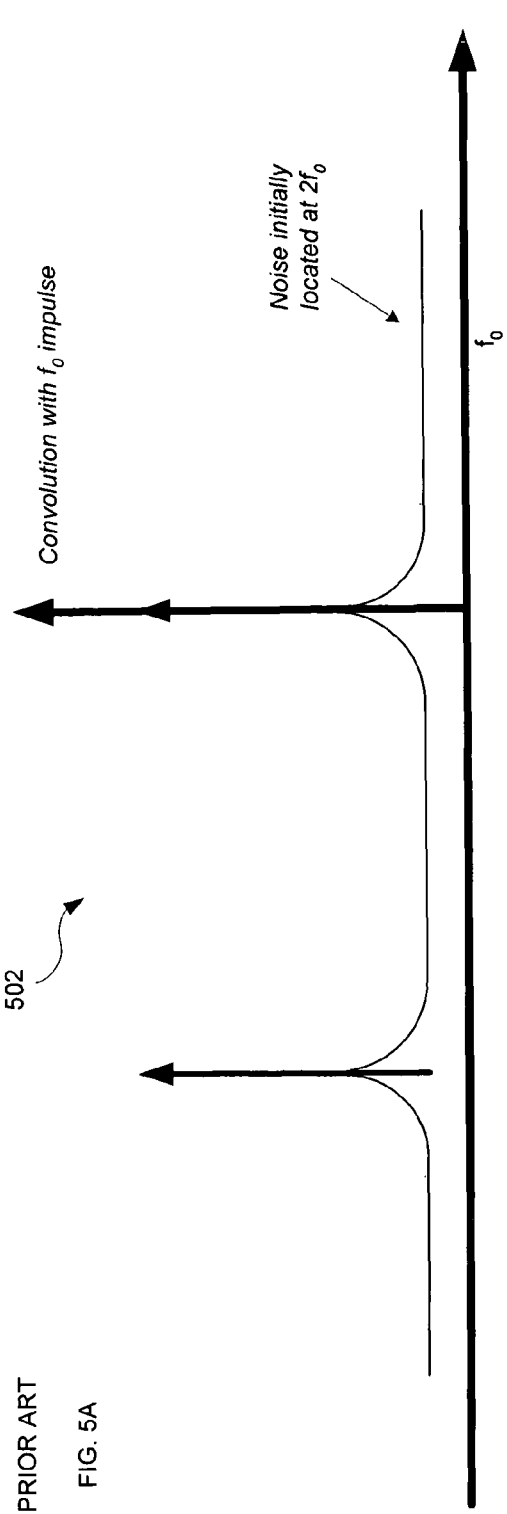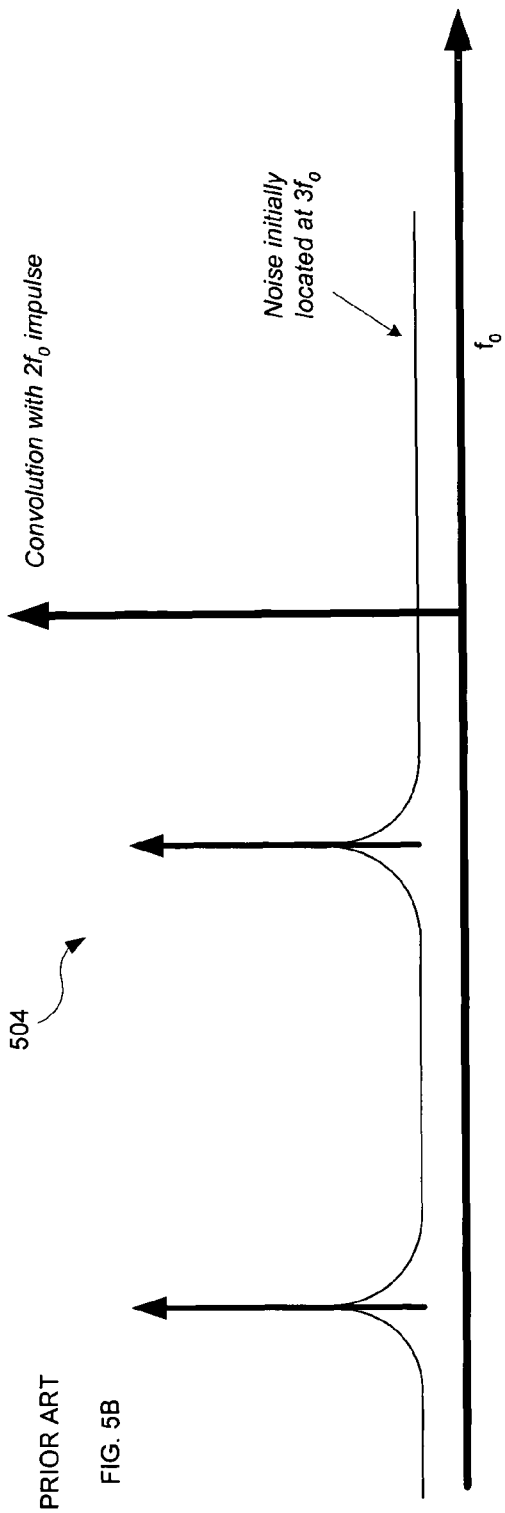

SYSTEM AND METHOD FOR REDUCING PHASE NOISE

CROSS-REFERENCE TO RELATED APPLICATIONS

The present application is a continuation-in-part of application Ser. No. 09/634,552, filed Aug. 8, 2000 which claims benefit from and priority to Application No. 60/160,806, filed Oct. 21, 1999; Application No. 60/163,487, filed Nov. 4, 1999; Application No. 60/163,398, filed Nov. 4, 1999; Application No. 60/164,442, filed Nov. 9, 1999; Application No. 60/164,194, filed Nov. 9, 1999; Application No. 60/164,314, filed Nov. 9, 1999; Application No. 60/165,234, filed Nov. 11, 1999; Application No. 60/165,239, filed Nov. 11, 1999; Application No. 60/165,356; filed Nov. 12, 1999; Application No. 60/165,355, filed Nov. 12, 1999; Application No. 60/172,348, filed Dec. 16, 1999; Application No. 60/201,335, filed May 2, 2000; Application No. 60/201,157, filed May 2, 2000; Application No. 60/201,179, filed May 2, 2000; Application No. 60/202,997, filed May 10, 2000; Application No. 60/201,330, filed May 2, 2000. The above referenced applications are hereby incorporated herein by reference in their entirety.

BACKGROUND OF THE INVENTION

Modern telecommunication systems are increasingly built using compact and cost efficient circuits. In particular, the family of low-cost, low-power transceivers has substantially matured in the past two decades. Because of cost issues, high performance semiconductor processes are not normally used for such transceivers. Therefore, high performance is generally achieved through optimum circuit design and innovative techniques.

One of the specifications of a transceiver is the transmitted spectrum phase noise. Often, a transmitted signal is directly or indirectly generated using a local oscillator. Therefore, the transmitted spectrum phase noise performance is tied to the performance of the local oscillator. Phase noise in the local oscillator of a transceiver can overwhelm nearby channels because the phase noise spectral density can grow directly with the transmitted signal power and, at a certain threshold, the phase noise in the signal generated by the local oscillator can be greater than another attenuated signal occupying the same frequency.

FIG. 1 is a block diagram illustrating a conventional transmitter 100. The transmitter 100 consists of a local oscillator 102, a divider 104, a mixer 106, a power amplifier 108, and an antenna 110. The oscillator 102 is a voltage controlled oscillator (VCO). The oscillator 102 is connected to the divider 104 which, in turn, is connected to the mixer 106. The mixer 106 is connected to the power amplifier 108 which, in turn, is connected to the antenna 110.

In operation, after the oscillator 102 generates a signal, various non-linear operations are applied to the generated signal. For example, the signal generated by the oscillator 102 is divided by the divider 104. The divided signal is then mixed with an outside signal 107 by the mixer 106. The mixed signal is then amplified by the amplifier 108 before being transmitted out via the antenna 110.

In some low-end applications, the transmitter 100 is implemented with the oscillator 102 connected directly to the antenna 110. However, in most typical applications, the divider 104, the mixer 106 and the power amplifier 108 are present. In addition, any number of linear buffers or non-linear buffers can be connected between the operational blocks. After the oscillator 102, however, each operational block can add to the noise profile of the signal generated by the oscillator 102, even if the operational blocks following the oscillator 102 are ideally noiseless.

FIG. 2 is a graphical depiction showing a typical phase noise curve of a conventional signal source. The phase noise curve 200 is drawn according to a logarithmic scale and, therefore, the $1/f^3$ region 202 and the $1/f^2$ region 204 appear linear with −30 dB/dec and −20 dB/dec slopes, respectively. Depending on the type of the conventional signal source, the $1/f^3$ region 202 may be substantially large or negligibly small. Due to subsequent buffers or a resistance from non-linear operators immediately after the signal source output, the phase noise profile curve 200 flattens to a minimum thermal noise floor level 206.

For example, a resistor can be coupled to an output of a signal source. The noise from the resistor propagates through the non-linear function of the signal source and increases the noise profile of the signal source. Referring to FIG. 2, the thermal noise floor 206 extends up into a number of the harmonics of the generated signal. Every time a signal with a corresponding phase noise profile goes through a non-linear operation (e.g., division, mixing, non-linear amplification, etc.), frequency components are translated. The translation of the frequency components is accomplished through, for example, an offset equal to the frequency of oscillation or its harmonic frequencies.

FIG. 3 is a functional diagram showing a translation of frequency components during a power amplification process 300 utilizing a conventional Class B power amplifier. The graph 302 is representative of a sample oscillating frequency such as, for example, a frequency generated by a VCO. The power amplifier 304 amplifies the signal 302, passes the portion of the oscillation in the positive input half cycles and zeroes the portion of the oscillation in the negative input half cycles. The resultant output of the power amplifier 304 is represented by the graph 306. The voltage gain during the positive half cycle of the power amplifier 304 illustrated in FIG. 3 can be assumed to be equal to one.

Mathematically, the process reflected on FIG. 3 corresponds to multiplying a cosine wave and a square wave in the time domain. In the frequency domain, the process is represented as a convolution of the impulses of a cosine wave and a series of diminishing impulses of a square wave. Referring to FIG. 4, a graphical depiction 400 of a frequency domain convolution of a sine wave and a square wave is shown. FIG. 4 is representative of the power amplification effect of the power amplifier of FIG. 3 in the frequency domain. The input cosine wave 402 is representative of a signal generated by an oscillator, prior to the application of a non-linear operation (e.g., a power amplification) to the signal. The input cosine signal can be characterized by a thermal noise floor level 403. In this case, the non-linear operations consist of a convolution of the oscillation spectrum with a series of evenly spaced impulses. The square wave 404 is also characterized by a noise profile, which is not reflected in FIG. 4 because the square wave 404 is assumed to be an ideal square wave. The square wave 404 is shown with a DC component, a main impulse at a frequency $f_0$ and additional harmonic impulses with declining amplitudes at respective frequencies $2f_0$, $3f_0$, $4f_0$, etc.

As a result of the convolution process, replicas of the oscillation spectrum are generated and added together. Referring to FIGS. 5A and 5B, there are illustrated graphical depictions 502 and 504 showing a convolution of a cosine wave and an impulse at $f_0$ of a square wave and a convolution of a cosine wave and an impulse at $2f_0$ of a square wave, respectively. Assuming that the thermal noise floor of the oscillation spectrum in graphical depictions 502 and 504 is a relatively wide band, an accumulation of the thermal noise floor occurs because of the folding of the spectrum onto itself. Therefore, the thermal noise at approximately $2f_0$ will fold down to approximately $f_0$ due to the convolution of the input cosine with the square impulse at $f_0$ (represented by the graphical depiction 502). Similarly, the thermal noise at approximately $3f_0$ will fold down to approximately $f_0$ due to the convolution of the input cosine with the square impulse at $2f_0$ (represented by the graphical depiction 504). The thermal noise level close to the oscillation frequency will, therefore, grow due to the non-linear operation. This characteristic is common to non-linear blocks.

In general, an increase in the thermal noise floor of a generated signal (e.g., an oscillator generated signal) is present even if noiseless blocks (e.g., ideal non-linear operators) follow the signal generator. One of the reasons for this is that the generated signal preserves its thermal noise floor characteristic after it has been generated and even preserves its thermal noise floor characteristic throughout any subsequent non-linear operations since the resulting convolution does not eliminate the thermal noise floor profile.

Further limitations and disadvantages of conventional and traditional approaches will become apparent through comparison of such systems with some aspects of the present invention as set forth in the remainder of the present application with reference to the drawings.

BRIEF SUMMARY OF THE INVENTION

Certain aspects of the present invention may be found in, for example, systems and methods that reduce phase noise. In one embodiment according to aspects of the present invention, a method that reduces phase noise may include, for example, one or more of the following: generating a signal at a particular frequency, the signal being associated with a harmonic frequency signal disposed at a harmonic frequency; and selectively attenuating frequency content disposed in a region around the harmonic frequency. The signal may be associated with a second harmonic frequency signal disposed at a second harmonic frequency. Frequency content disposed in a region around the second harmonic frequency may be selectively attenuated. One or more non-linear operations may be applied to the signal and the applied signal may be transmitted. For example, the signal may be divided, may be mixed with a reference signal, and/or may be amplified. The signal may be generated, for example, by a fixed frequency oscillator, a voltage controlled oscillator, and/or a current controlled oscillator. The frequency content may be selectively attenuated by at least one attenuating circuit. Each attenuating circuit may comprise, for example, an integrated component and/or a discrete component. Each attenuating circuit may also comprise one or more harmonic traps. The signal may be buffered prior to selectively attenuating the frequency content. The buffering may be performed by a buffer. The selective attenuating of the frequency content may be performed within the buffer. The signal may be, for example, a single-ended signal, a differential signal and/or a set of signals in quadrature. The selective attenuating may comprise, for example, reducing, canceling, notching and/or band stopping frequency content disposed in a region around one or more harmonic frequencies.

In another embodiment according to aspects of the present invention, a circuit that reduces phase noise may be provided. The circuit may comprise, for example, a signal generator that generates a signal at a particular frequency in which the signal may be associated with a harmonic frequency signal disposed at a harmonic frequency, and an attenuating circuit that selectively attenuates frequency content disposed in a region around the harmonic frequency. A buffer that buffers the signal may be provided in which the buffer may be coupled to the signal generator. The attenuating circuit may be disposed, for example, within the buffer. A non-linear operation circuit may apply at least one non-linear operation to the signal to obtain an outgoing signal. A transmitting circuit may transmit the outgoing signal. An antenna may be provided in the transmitting circuit, for example, to transmit the outgoing signal. A divider may be provided that divides the signal. A mixer may be provided that mixes the signal with a reference signal. An amplifier may be provided that amplifies the signal. The signal generator may comprise, for example, a fixed frequency oscillator, a voltage controlled oscillator, and/or a current controlled oscillator. The attenuating circuit may comprise one or more integrated components and/or discrete components. The attenuating circuit may comprise at least one harmonic trap.

In yet another embodiment according to aspects of the present invention, a system that reduces phase noise may comprise, for example, a signal generator that generates a signal at a particular frequency in which the signal may be associated with a harmonic frequency signal disposed at a harmonic frequency, and a buffer that buffers the signal in which the buffer may be adapted to selectively attenuate frequency content disposed in a region around the harmonic frequency. The signal may be, for example, a single-ended signal, a differential signal and/or a set of signals in quadrature. The signal generator may comprise, for example, a differential output signal generator. The buffer may comprise, for example, a differential pair of transistors in which the differential pair of transistors may be adapted to receive the signal. The buffer may also comprise, for example, a harmonic trap that may be adapted to attenuate frequency content disposed in a region around the harmonic frequency signal. The harmonic trap may be disposed, for example, across a differential output of the buffer.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5A is a graphical depiction showing a convolution of a cosine wave and an $f_0$ impulse of a square wave.

FIG. 5B is a graphical depiction showing a convolution of a cosine wave and a $2f_0$ impulse of a square wave.

DETAILED DESCRIPTION OF THE INVENTION

Certain aspects of the present invention may be found in, for example, systems and methods that reduce phase noise. In one embodiment according to aspects of the present invention, a method that reduces phase noise may include, for example, one or more of the following: generating a signal at a particular frequency, the signal being associated with a harmonic frequency signal disposed at a harmonic frequency; and selectively attenuating frequency content disposed in a region around the harmonic frequency. The signal may be, for example, a single-ended signal, a differential signal and/or a quadrature signal. The signal may be associated with other harmonic frequency signals disposed at respective harmonic frequencies. Frequency content disposed in a region around the respective harmonic frequencies may be selectively attenuated. One or more non-linear operations may be applied to the signal and the applied signal may be transmitted, for example, as a wireless signal (e.g., a radio frequency signal) via an antenna.

Some embodiments according to the present invention may provide that frequency content may be selectively attenuated by one or more attenuating circuits. An attenuating circuit may comprise, for example, one or more integrated components, discrete components, active components and/or passive components. An attenuating circuit may comprise one or more harmonic traps. The selective attenuating may comprise, for example, reducing, canceling, notching and/or band stopping frequency content disposed in a region around one or more harmonic frequencies.

Figure 1:
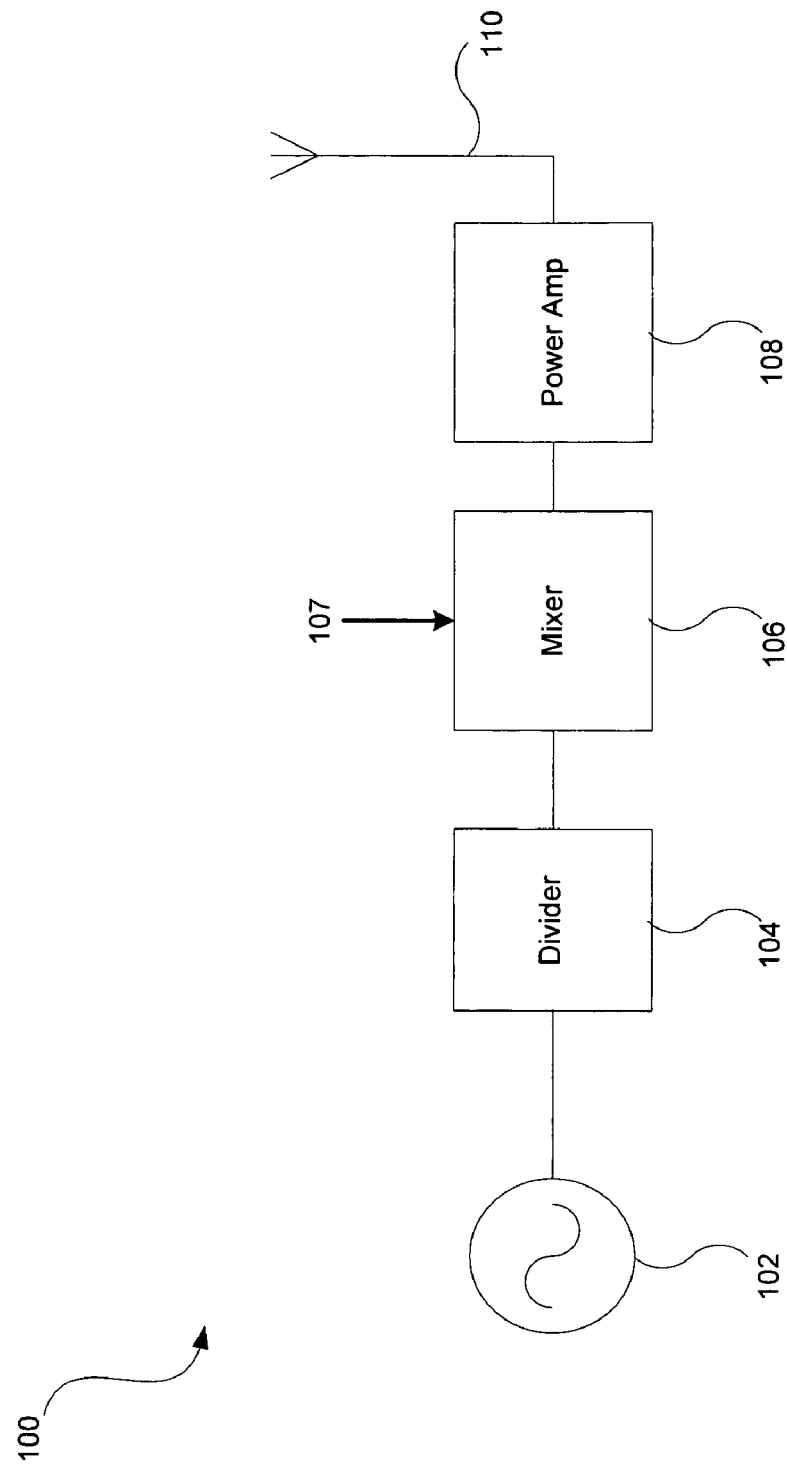
FIG. 1 is a block diagram illustrating a conventional transmitter.
Figure 2:
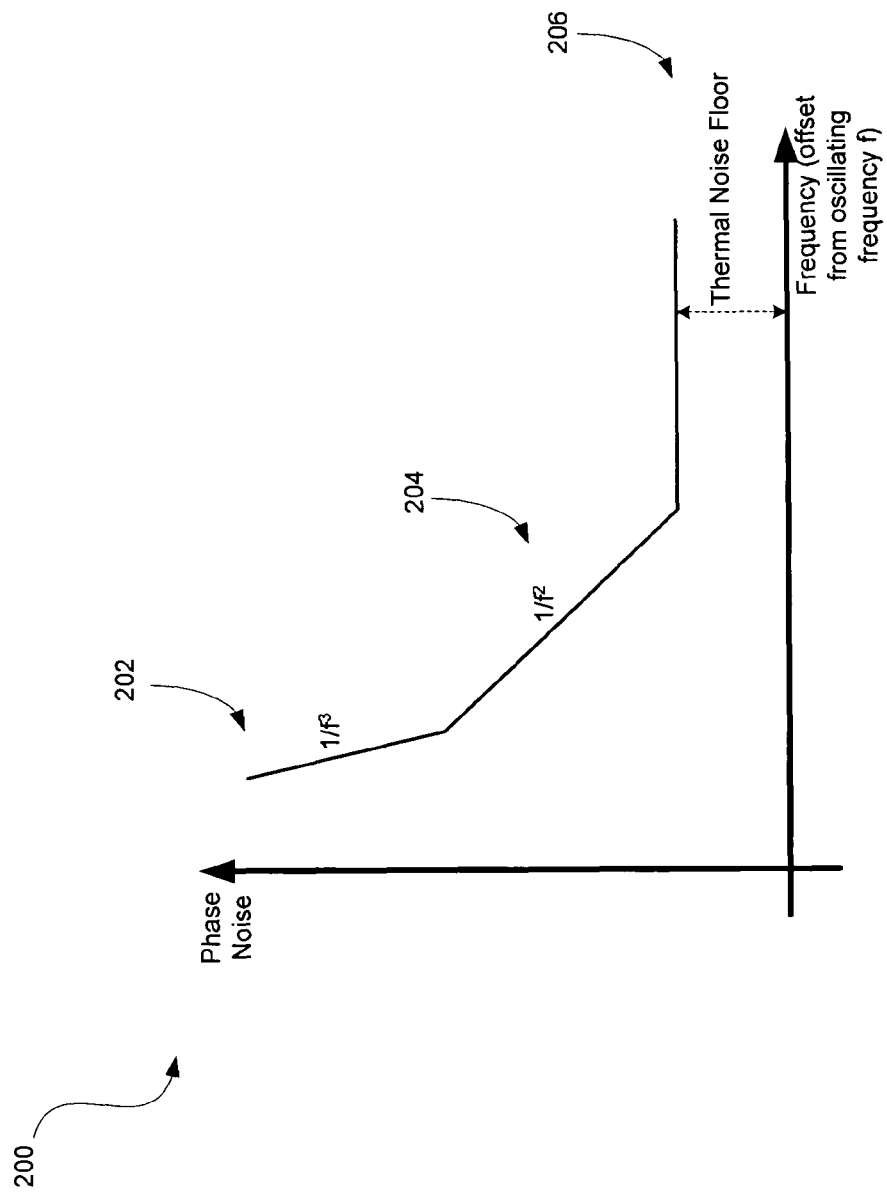
FIG. 2 is a graphical depiction showing a typical phase noise curve of a conventional signal source.
Figure 3:
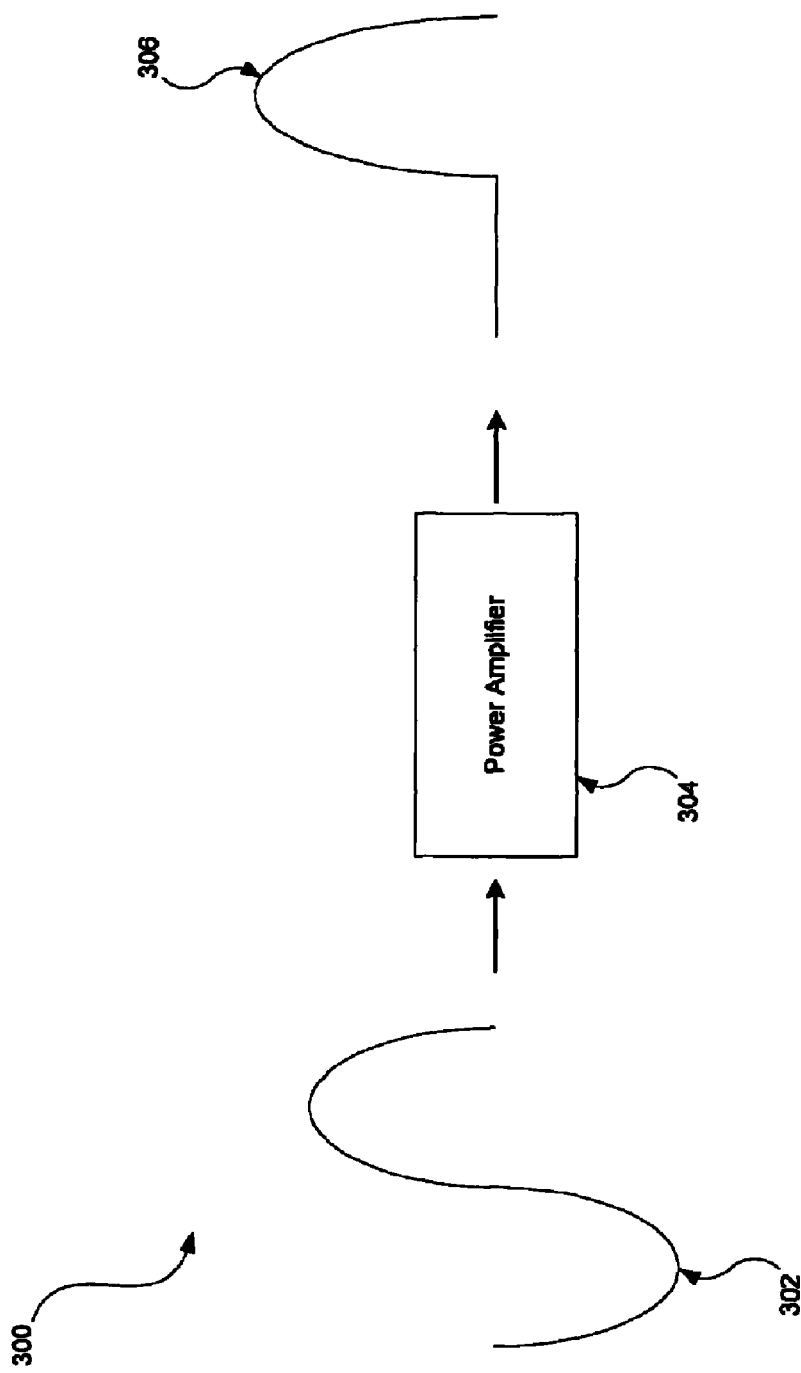
FIG. 3 is a functional diagram showing a translation of frequency components during a power amplification process utilizing a conventional Class B power amplifier.
Figure 4:
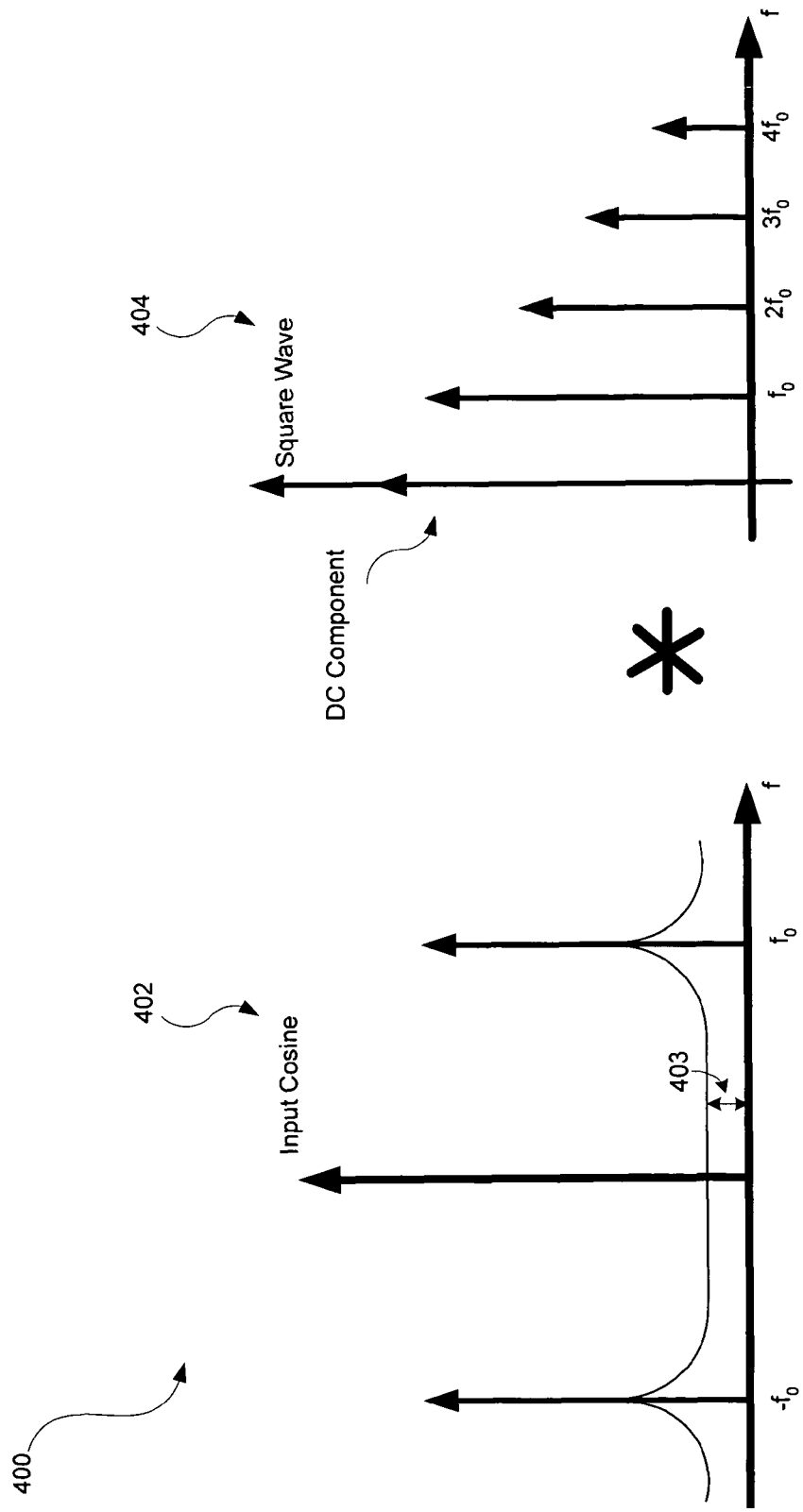
FIG. 4 is a graphical depiction showing a convolution of a cosine wave and a square wave in a frequency domain.
Figure 6:
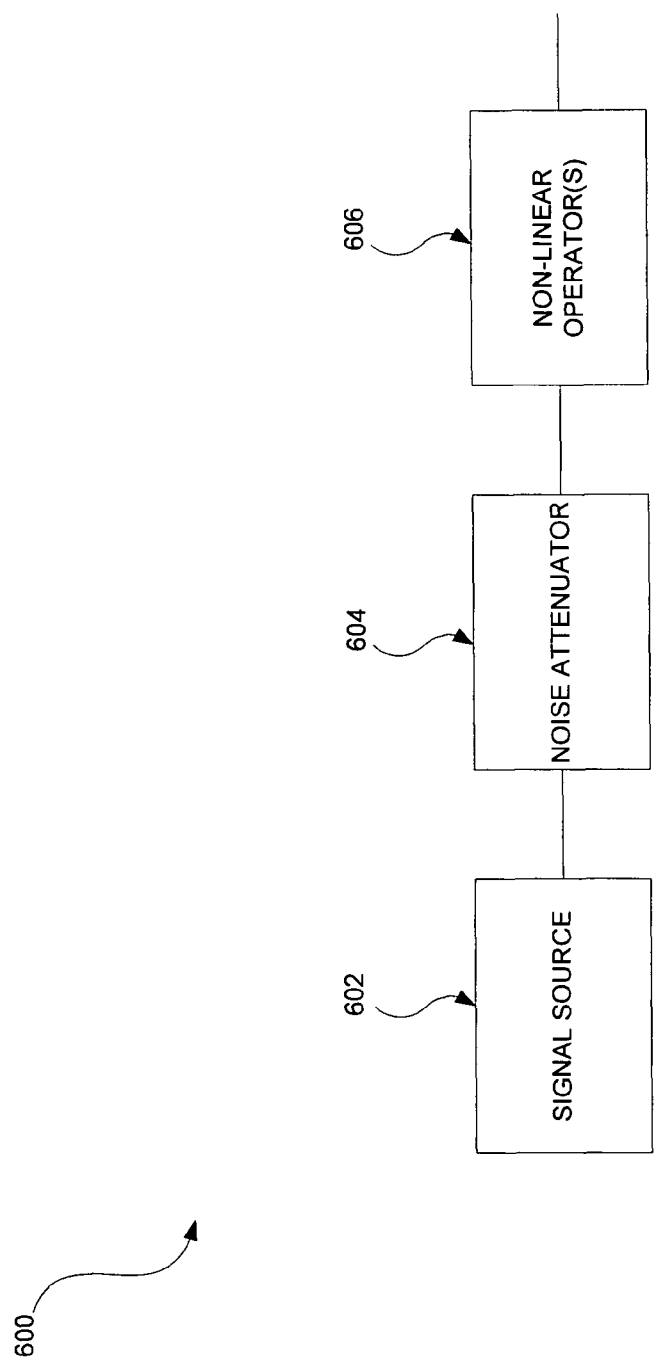
FIG. 6 is a block diagram illustrating a circuit implementing a noise attenuator in accordance with an embodiment of the present invention.

FIG. 6 is a block diagram illustrating a circuit 600 implementing a noise attenuator in accordance with an embodiment of the present invention. The circuit 600 may comprise, for example, a signal source 602, a noise attenuator 604, and a non-linear operator 606. The signal source 602 may be coupled to the noise attenuator 604 which, in turn, may be coupled to the non-linear operator 606. The signal source 602 may comprise, for example, an oscillator (e.g., a voltage controlled oscillator). The noise attenuator 604 may comprise, for example, circuitry adapted to attenuate one or more specific harmonics of the generated signal from the signal source 602. The non-linear operator 606 may be adapted to perform one or more non-linear operations with a signal received from the noise attenuator 604.

In operation, the signal source 602 may generate a signal and the generated signal may be characterized with a particular thermal noise profile. The signal may include, for example, one or more single-ended signals, differential signals, quadrature signals or other types of signals. After the generated signal is communicated to the noise attenuator 604, the noise attenuator 604 may attenuate, for example, one or more harmonics from the generated signal. The attenuation may occur, for example, in a designed frequency range around each selected harmonic. The attenuation may include, for example, reducing, canceling, notching, band stopping frequency content at the selected harmonic frequencies, at approximately the selected harmonic frequencies or at a frequency range (e.g., a region) around or including the selected harmonic frequencies. In one embodiment of the present invention, the noise attenuator 604 may be adapted to attenuate, for example, the second harmonic of the signal generated by the signal source 602. Subsequently, one or more non-linear operators 606 may be applied to the attenuated signal received from the noise attenuator 604. In this way, any subsequent convolution of the signal cosine characteristic of the generated signal with any subsequent non-linear operation (e.g., an impulse train) will result in a signal with a substantially reduced thermal noise floor profile.

Figure 7:
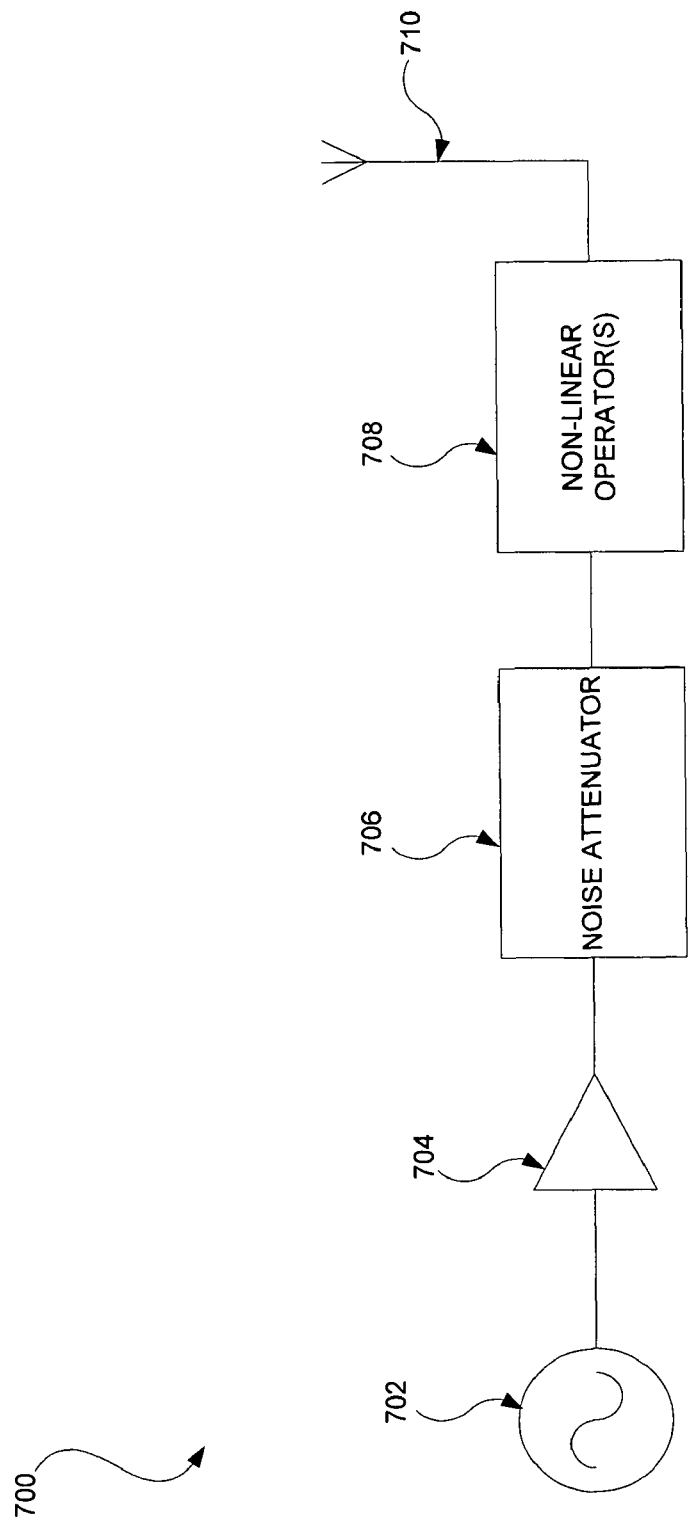
FIG. 7 is a block diagram illustrating a transmitter implementing a noise attenuator in accordance with an embodiment of the present invention.

FIG. 7 is a block diagram illustrating a transmitter 700 implementing a noise attenuator in accordance with an embodiment of the present invention. The transmitter 700 may comprise, for example, an oscillator 702, a buffer 704, a noise attenuator 706, one or more non-linear operators 708, and an antenna 710. The oscillator 702 may be coupled to the buffer 704 which, in turn, may be coupled to the noise attenuator 706. The noise attenuator 706 may be coupled to the one or more non-linear operators 708 which, in turn, may be coupled to the antenna 710. The oscillator 702 may comprise, for example, a voltage controlled oscillator. The oscillator 702 may generate a signal with a predetermined frequency characteristic such as, for example, a frequency $f_0$. The buffer 704 may be adapted to buffer the signal received from the oscillator 702. Although illustrated as between the oscillator 702 and the noise attenuator 706, the buffer 704 can be disposed in addition or different locations. For example, an additional buffer may be disposed between the noise attenuator 706 and the non-linear operators 708. The noise attenuator 706 may comprise, for example, circuitry adapted to attenuate one or more selected harmonics of the incoming signal. In addition, although illustrated as separate components, the various components may demonstrate different levels of integration. For example, the buffer 704 may be integrated with the noise attenuator 706. In fact, the entire transmitter 700 may be part of an integrated radio transceiver which may be disposed on one or more integrated circuit chips.

In operation, the oscillator 702 may generate a signal with a specific thermal noise profile characteristic. The generated signal may then be buffered within the buffer 704. The buffered signal may then be communicated to the noise attenuator 706. The noise attenuator 706 may be adapted to attenuate one or more harmonics of the generated signal with frequency $f_0$. In one embodiment of the present invention, the noise attenuator 706 may be adapted to attenuate the second harmonic $2f_0$ of the generated signal. After the signal has been processed by the noise attenuator 706, one or more non-linear operators 708 may be applied. The non-linear operator 708 may comprise, for example, one or more dividers, mixers and/or power amplifiers (e.g., non-linear power amplifiers). After the non-linear operators 708 have been applied, the resulting signal may be transmitted as a wireless signal (e.g., a radio frequency signal) via the antenna 710. In another embodiment according to the present invention, the resulting signal may be transmitted as a wired signal to a network (e.g., a local area network, a wide area network, the Internet, an Ethernet, etc.)

Figure 8:
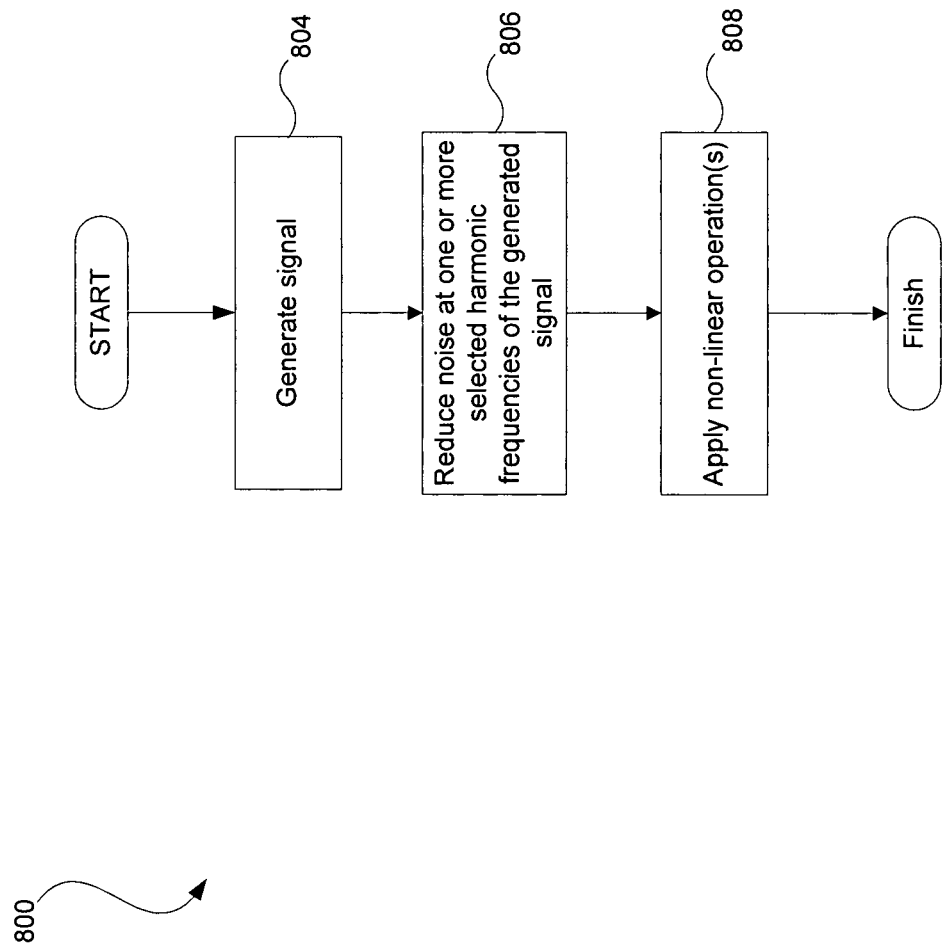
FIG. 8 is a flow diagram illustrating a method that reduces signal noise in accordance with an embodiment of the present invention.

FIG. 8 is a flow diagram illustrating a method 800 that reduces signal noise in accordance with an embodiment of the present invention. In step 804, a signal may be generated. For example, the signal may be generated by an oscillator or a different type of signal generator. In step 806, the noise at one or more selected harmonic frequencies of the generated signal may be reduced (e.g., cancelled, notched, band stopped, etc.) Any subsequent non-linear operations may be applied to the resulting signal in step 808.

Figure 9A:
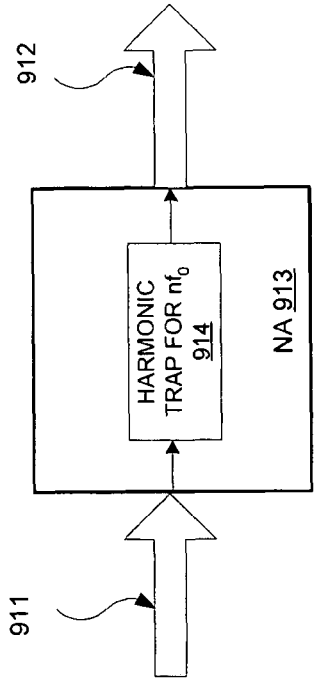
FIG. 9A is a block diagram of a noise attenuator implementing a harmonic trap in accordance with an embodiment of the present invention.

FIG. 9A is a block diagram of a noise attenuator 913 implementing a harmonic trap in accordance with an embodiment of the present invention. The noise attenuator 913 may comprise, for example, a harmonic trap 914. The harmonic trap 914 may be adapted to attenuate a particular harmonic of an incoming signal. For example, the incoming signal 911 may be characterized by a main frequency $f_0$ and multiple harmonic frequencies of the main frequency $f_0$. The harmonic trap 914 may attenuate one or more harmonics. FIG. 9A illustrates an embodiment of a harmonic trap that may attenuate the n-th harmonic of the incoming signal 911 at a frequency $nf_0$. An output signal 912 may be generated from the harmonic trap 914 or the noise attenuator 913. Although illustrated as a series trap, the present invention also contemplates parallel traps such as, for example, shunt traps.

Figure 9B:
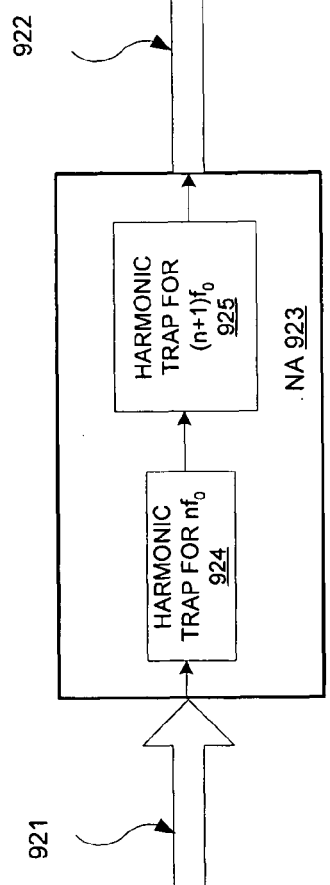
FIG. 9B is a block diagram of a noise attenuator implementing two harmonic traps in accordance with an embodiment of the present invention.

FIG. 9B is a block diagram of a noise attenuator 923 implementing two harmonic traps in accordance with an embodiment of the present invention. The noise attenuator 923 may comprise, for example, two harmonic traps: harmonic trap 924 and harmonic trap 925. The harmonic traps 924 and 925 may each be adapted to attenuate a particular harmonic frequency of the incoming signal. For example, the incoming signal 921 may be characterized by a main frequency at frequency $f_0$ and multiple harmonics of frequency $f_0$. After receiving the incoming signal 921, the noise attenuator 923 may attenuate specific harmonics of frequency $f_0$ from the incoming signal 921. For example, the harmonic trap 924 may attenuate the n-th harmonic and the (n+1)-th harmonic of frequency $f_0$ of the incoming signal 921. In this way, the noise attenuator 923 attenuates the harmonic frequencies $nf_0$ and $(n+1)f_0$ of the incoming signal 921 and generates the output signal 922. Although illustrated as consecutive harmonics, the present invention also contemplates attenuating any two or more harmonic frequencies (e.g., selected non-consecutive harmonic frequencies).

Figure 9C:
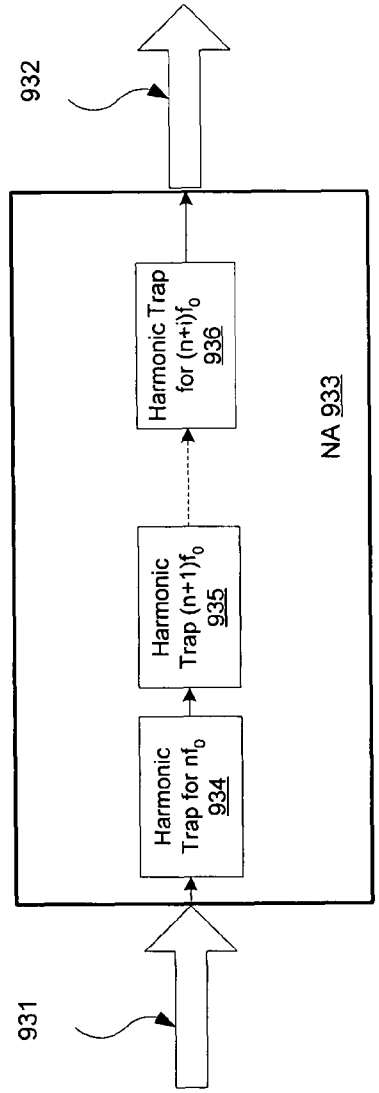
FIG. 9C is a block diagram of a noise attenuator implementing a plurality of harmonic traps in accordance with an embodiment of the present invention.

FIG. 9C is a block diagram of a noise attenuator 933 implementing a plurality of harmonic traps in accordance with an embodiment of the present invention. The noise attenuator 933 may comprise, for example, a plurality of harmonic traps 934, 935 and 936. One or more of the harmonic traps 934, 935 and 936 may be adapted to attenuate a particular harmonic frequency of the incoming frequency. For example, the incoming signal 931 may be characterized by a frequency $f_0$ and corresponding plurality of harmonics of frequency $f_0$. After the incoming signal 931 is received by the noise attenuator 933, the harmonic trap 934 may attenuate the n-th harmonic frequency of the incoming signal. Similarly, the harmonic trap 935 may attenuate the (n+1)-th harmonic of the incoming signal. In accordance with an embodiment of the present invention, the noise attenuator 933 may comprise a specific number of harmonic traps so that only specific harmonics from an incoming signal 931 are attenuated. For example, the noise attenuator 933 may also be adapted to attenuate all the harmonics starting from the n-th harmonic up to the (n+i)-th harmonic of the incoming signal 931. Attenuation of the (n+i)-th harmonic may be preformed by the harmonic trap 936. In effect, the noise attenuator 933 may attenuate all the harmonics of the incoming signal 931 starting from the n-th harmonic to the (n+i)-th harmonic. After all the harmonics have been attenuated by the noise attenuator 933, an output signal 932 may be generated.

Although illustrated as harmonic traps trapping consecutive harmonic frequencies, the present invention contemplates that each harmonic trap may trap any selected harmonic frequency. The present invention also contemplates that the trapping may occur in any order and that any selected harmonic frequency may be trapped. Various embodiments according to the present invention may use series harmonic traps, parallel harmonic traps or some combination thereof. Although illustrated as separate blocks, the harmonic traps may be integrated with each other as well as with other components in noise attenuator or other transceiver components.

Some embodiments according to the present invention may provide harmonic traps that may be adjustable for trapping a selected harmonic frequency. In fact, the harmonic traps may also be programmable for particular harmonic frequencies. The control of the harmonic traps may also provide switchable harmonic traps. For example, some embodiments according to the present invention may provide switching means that allow for the switching of one or more harmonic traps in or out of the circuitry of the noise attenuator. For example, a switch coupled to a particular harmonic trap may provide a means by which a signal can bypass the particular harmonic trap.

Although the some embodiments according to the present invention may relate to trapping harmonic frequencies, the present invention need not be so limited. Thus, frequency traps may be designed that trap selected frequencies which may not be harmonic frequencies.

Figure 9D:
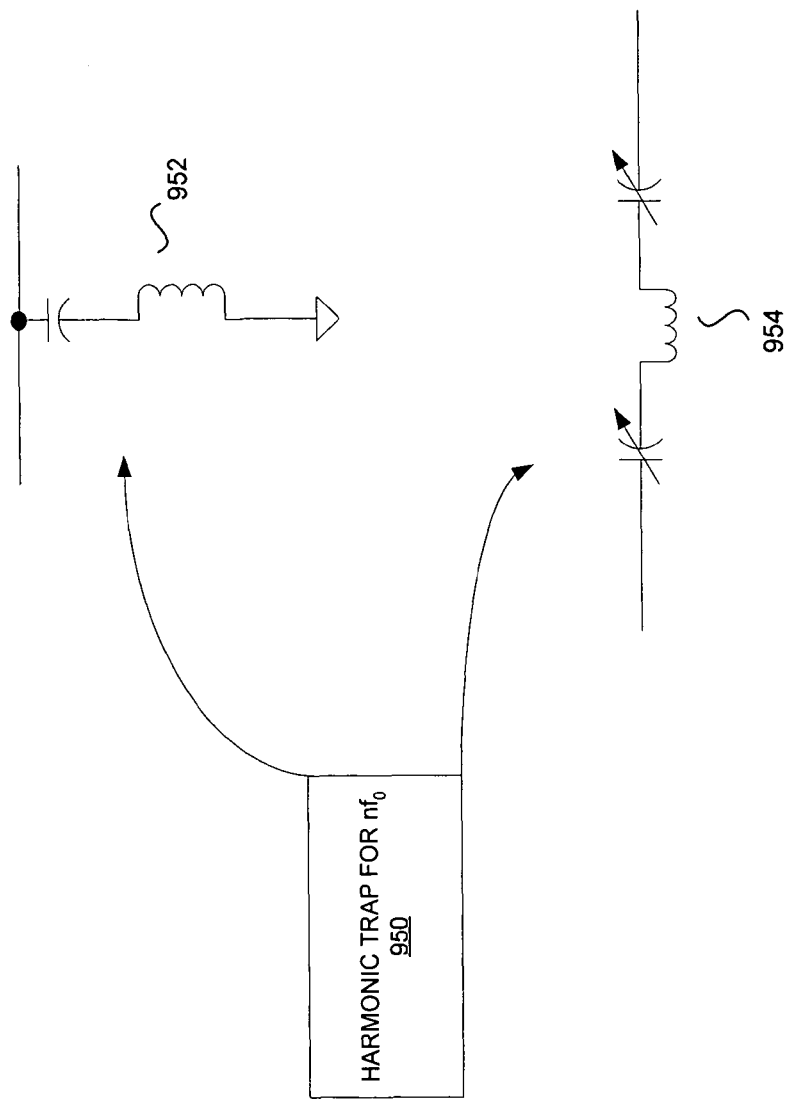
FIG. 9D is a block diagram illustrating a harmonic trap that may be connected in parallel or in series in accordance with an embodiment of the present invention.

FIG. 9D is a block diagram illustrating a harmonic trap 950 that may be connected in parallel or in series or in some combination thereof in accordance with an embodiment of the present invention. The harmonic trap 950 may comprise, for example, a trap that traps the n-th harmonic frequency of a signal with main frequency $f_0$. The harmonic trap 950 may comprise, for example, a parallel harmonic trap 952 or a series harmonic trap 954 or some combination thereof. The harmonic trap 952 may comprise, for example, a capacitor and an inductor coupled to ground. The parallel harmonic trap 952 may be connected in parallel to an incoming signal path. The parallel harmonic trap 952 may be adapted to attenuate the n-th harmonic of an incoming signal by shunting the n-th harmonic to ground. In an embodiment of the present invention, the harmonic trap 950 may comprise a series harmonic trap 954. The series harmonic trap 954 may comprise, for example, a plurality of variable capacitors and an inductor. The harmonic trap 954 may be connected in series to a signal path.

In accordance with another embodiment of the present invention, a harmonic trap, such as the harmonic trap 950, may be adapted to attenuate the n-th harmonic of an incoming signal with a main frequency $f_0$ as well as a region around the n-th harmonic of the incoming signal $f_0$. For example, the harmonic trap 950 may act as a band stop filter and may be adapted to filter out the n-th harmonic as well as a region in frequency space around the n-th harmonic of an incoming signal with main frequency $f_0$. The region may include the n-th harmonic frequency, although the selected harmonic frequency need not be centered in the designed region.

Figure 10:
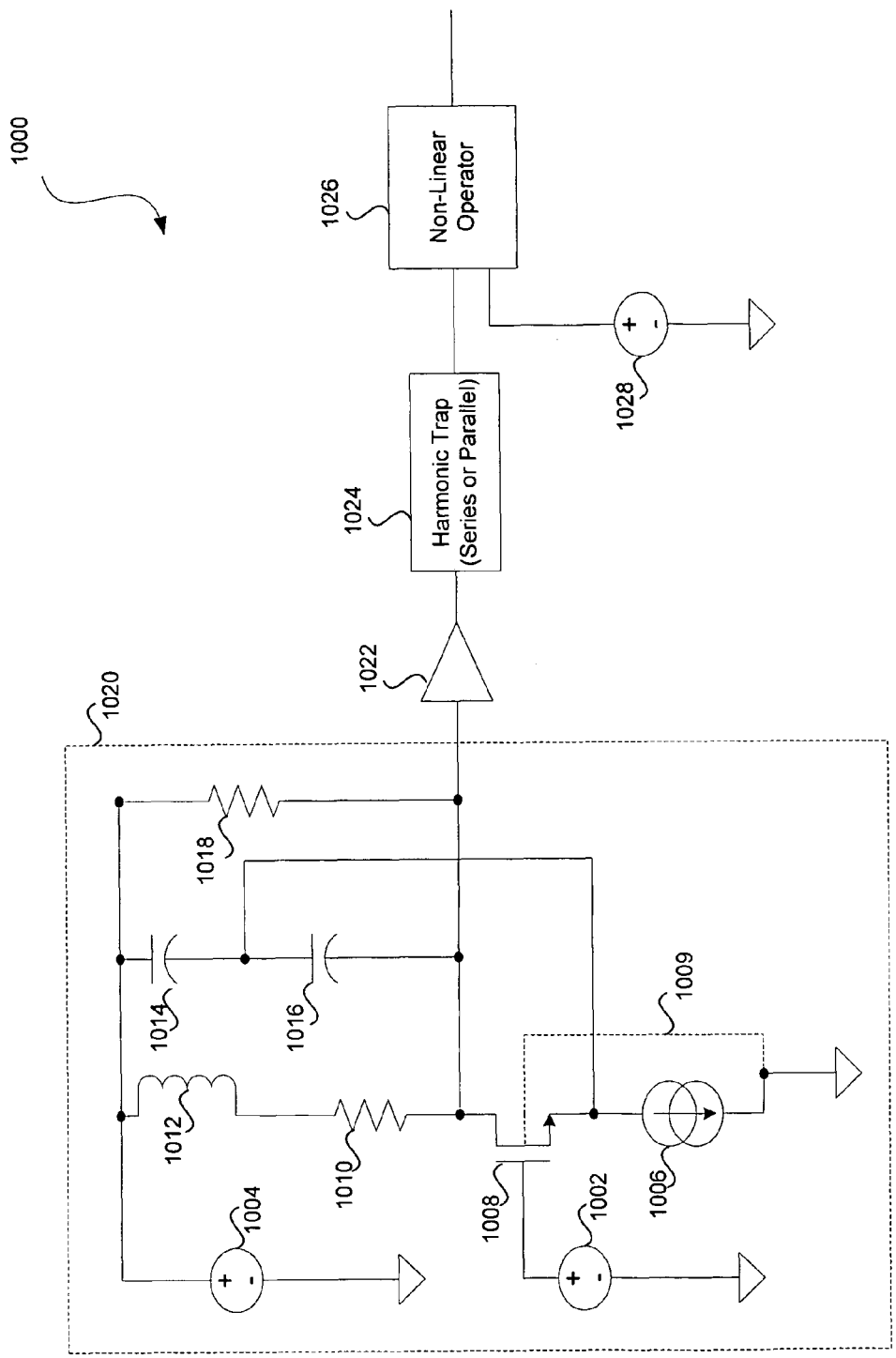
FIG. 10 is an electrical diagram of a circuit implementing a signal generator in combination with a harmonic trap in accordance with an embodiment of the present invention.

FIG. 10 is an electrical diagram of a circuit 1000 implementing a signal generator in combination with a harmonic trap in accordance with an embodiment of the present invention. The circuit 1000 may comprise, for example, a single-ended oscillator 1020, a buffer 1022, a harmonic trap 1024, a voltage source 1028, and a non-linear operator 1026. The single-ended oscillator 1020 may be coupled to the buffer 1022 which, in turn, may be coupled to the harmonic trap 1024. The harmonic trap 1024 may be coupled to the non-linear operator 1026.

The single-ended oscillator 1020 may comprise, for example, an inductor 1012, capacitors 1014 and 1016, resistors 1010 and 1018, a transistor 1008, voltage sources 1004 and 1002, and a current source 1006. Although illustrated as a FET, the transistor 1008 may comprise, for example, a MOS transistor, a CMOS transistor, a bipolar junction transistor, a hybrid bipolar junction transistor, a semiconductor transistor, a compound semiconductor transistor, another types of transistor or any other amplifying device. The gate terminal of the transistor 1008 may be connected to the voltage source 1002 which, in turn, may be connected to ground (e.g., electrical ground). The source terminal of the transistor 1008 may be connected to the current source 1006 which, in turn, is connect to ground. The body terminal of the transistor 1008 may also be grounded via an optional connection 1009. The inductor 1012, the resistors 1010 and 1018 and the capacitors 1014 and 1016 may be appropriately selected so that an output signal at a particular main frequency may be generated at the drain terminal of the transistor 1008. The output of the transistor 1008, which may be disposed at the drain terminal of the transistor 1008, may be connected to the single-ended output of the oscillator 1020. The voltage source 1004 may be connected to ground at its negative terminal and, at its positive terminal, may be connected to the inductor 1012, the capacitor 1014 and the resistor 1018. The voltage source 1002 may be connected to ground at is negative terminal and, at its positive terminal, may be connected to the gate terminal of the transistor 1008.

The harmonic trap 1024 may comprise, for example, one or more harmonic traps adapted to attenuate one or more harmonics of an incoming signal. In addition, the harmonic trap 1024 may comprise, for example, one or more harmonic traps that are connected in series, in parallel, or in some combination thereof to the incoming signal. The non-linear operator 1026 may be connected to the voltage source 1028 which, in turn, may be connected to ground. The non-linear operator 1026 may comprise, for example, one or more non-linear operators. The non-linear operator 1026 may comprise, for example, one or more dividers, mixers, and/or power amplifiers (e.g., non-linear power amplifiers).

In operation, a specific frequency signal may be generated at the single-end output of the oscillator 1020. The main frequency at which the generated signal oscillates may be determined, for example, by the component values of the inductor 1012, the resistors 1010 and 1018 and the capacitors 1014 and 1016. The generated signal may then be buffered by the buffer 1022. The buffered signal may then be sent to the harmonic trap 1024. The harmonic trap 1024 may attenuate one or more harmonics of the signal generated by the single ended oscillator 1020. In accordance with an embodiment of the present invention, the harmonic trap 1024 may selectively attenuate one or more harmonics of the generated signal. In accordance with another embodiment of the present invention, the harmonic trap 1024 may attenuate the generated signal within a region around the harmonics. One or more non-linear operators 1026 may be applied at the output of the harmonic trap 1024.

In yet another embodiment of the present invention, the circuit 1000 may utilize no buffers. For example, the circuit 1000 may comprise a signal generator 1020 that may be coupled to a harmonic trap 1024 without utilizing a buffer. The harmonic trap 1024 may then be coupled to one or more non-linear operators 1026. In yet another embodiment of the present invention, the harmonic trap 1024 may be implemented within the buffer 1022.

Figure 11:
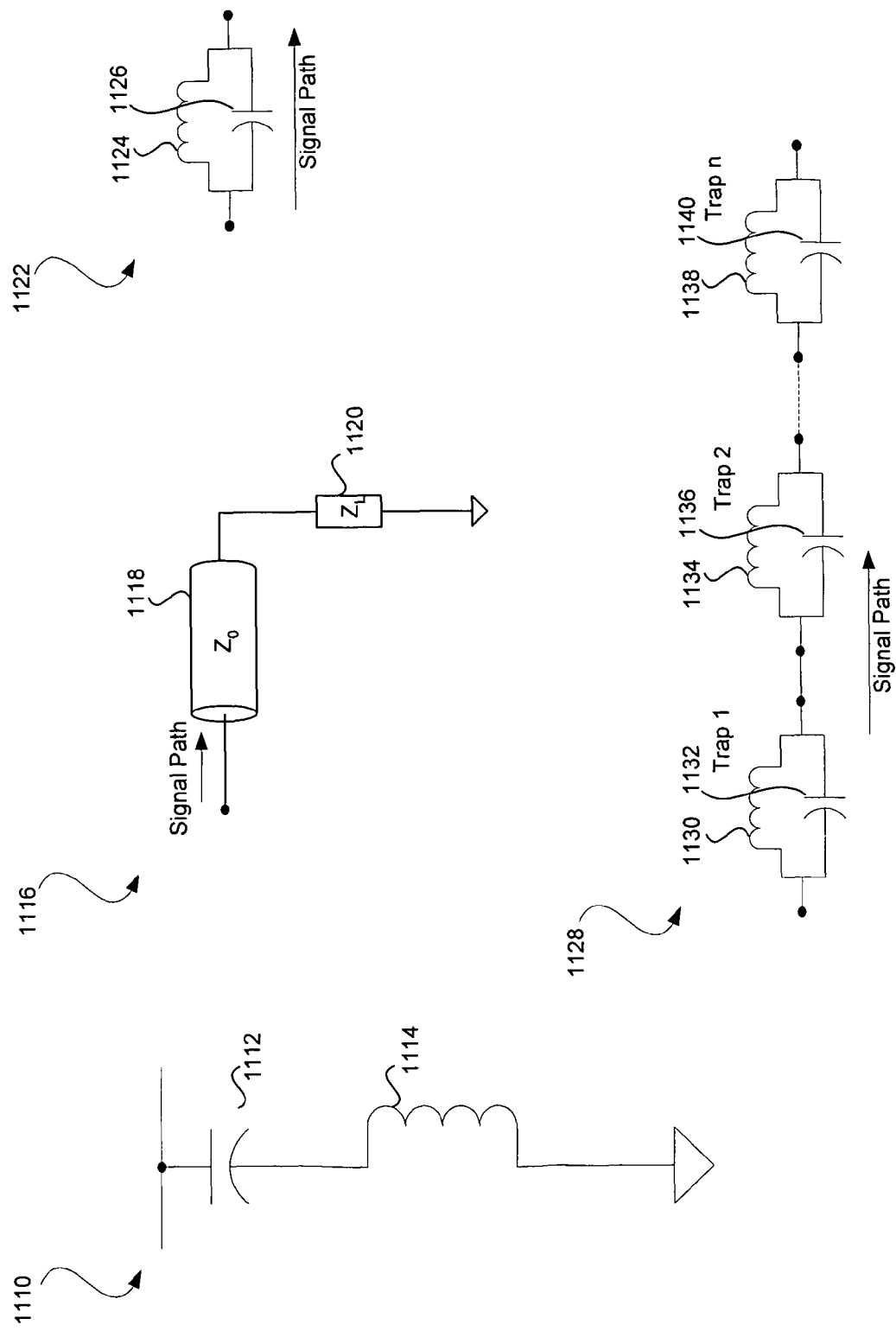
FIG. 11 is an electrical diagram of exemplary harmonic traps that may be utilized in accordance with an embodiment of the present invention.

FIG. 11 is an electrical diagram of exemplary harmonic traps that may be utilized in accordance with various embodiments of the present invention. The harmonic trap 1110 may comprise, for example, a capacitor 1112 and an inductor 1114. The values of the capacitor 1112 and the inductor 1114 may be selected so that the harmonic trap 1110 attenuates a specific harmonic and/or a region around the specific harmonic of an incoming signal. In one embodiment, the capacitor 1112 is a variable capacitor or the inductor 1114 is a variable inductor. In addition, the harmonic trap 1110 may be connected in parallel so that the specific harmonic or a frequency range (e.g., a region) including the specific harmonic of an incoming signal may be shunted to ground. By attenuating one or more harmonics, and/or regions around the one or more harmonics, a harmonic trap, in accordance with an embodiment of the present invention, may reduce the phase noise profile of a generated signal prior to the execution of a non-linear operation. In one embodiment, by reducing the frequency content around one or more harmonic frequencies of a main frequency, the phase noise profile might not substantially grow or may be substantially reduced at or around the main frequency even during a non-linear operation (e.g., a convolution operation) in which the incoming signal spectrum is folded back onto itself.

The harmonic trap 1122 may comprise, for example, an inductor 1124 and a capacitor 1126 connected in parallel. The inductor 1124 may have an inductance L and the capacitor may have a capacitance C. The harmonic trap 1122 may be tuned to attenuate the n-th harmonic of a signal with main frequency $f_0$ by changing L and C so that $$\frac{1}{2\pi\sqrt{LC}} = nf_0.$$

The harmonic trap 1122 may be connected in series with a signal path of an incoming signal. In another embodiment, the harmonic trap 1122 may be connected to ground to provide a shunt path to ground for the n-th harmonic of the signal.

Multiple harmonic traps such as, for example, a plurality of harmonic traps 1122 may be utilized in a specific circuit in accordance with an embodiment of the present invention. For example, a multi-harmonic trap 1128 may be utilized. The multi-harmonic trap 1128 may comprise n multiple traps such as, for example, Traps 1 to n. Each of the n harmonic traps may comprise, for example, an inductor (e.g., the inductors 1130, 1134, and 1138) and a capacitor (e.g., the capacitors 1132, 1136, and 1140) connected in parallel. Each of the n traps may be characterized by inductance $L_n$ and capacitance $C_n$. The capacitor and the inductor in each of the n traps may be tuned so that each trap attenuates a specific harmonic of an incoming signal. For example, Trap n may be tuned to attenuate the n-th harmonic of a signal f by changing $L_n$ and $C_n$ so that $$\frac{1}{2\pi\sqrt{L_n C_n}} = nf_0.$$

In another embodiment, the capacitors, the inductors and their interactions between individual traps may be considered in setting the trapping harmonic frequency values of the composite harmonic trap.

If multiple traps are utilized, then there might be no need for a buffer between them. In one embodiment according to the present invention, a transmission line configuration is utilized to attenuate selected harmonics of an incoming signal. The transmission line configuration 1116 of the harmonic trap may comprise, for example, a transmission line 1118 connected to a grounded load 1120. The transmission line 1118 may be characterized by an impedance $Z_0$ and the grounded load 1120 may be characterized by an impedance $Z_L$. By selecting the impedances $Z_0$ and $Z_L$ and transmission line length, the transmission line 1118 may be utilized to attenuate selected harmonics of the incoming signal (e.g., the odd harmonics of an incoming signal, the even harmonics or all of the harmonics of an incoming signal). If, for example, the transmission line 1118 is open only for even harmonics and closed to odd number harmonics, the transmission line 1118 may act as a series of harmonic traps for the odd harmonics. Since the trapping action is a characteristic of the transmission line, it might not be necessary to utilize additional filters in a harmonic trap implementing a transmission line. A harmonic trap in accordance with an embodiment of the present invention may comprise, for example, one or more passive components that attenuate specific harmonic. For example, a harmonic trap may be designed utilizing, for example, one or more LC sections, RC sections or RL sections. Inductors, resistors and capacitors may also be formed from active components such as, for example, transistors. The use of active components may provide for the miniaturization of components, thereby promoting integration onto one or more integrated circuit chips.

Figure 12:
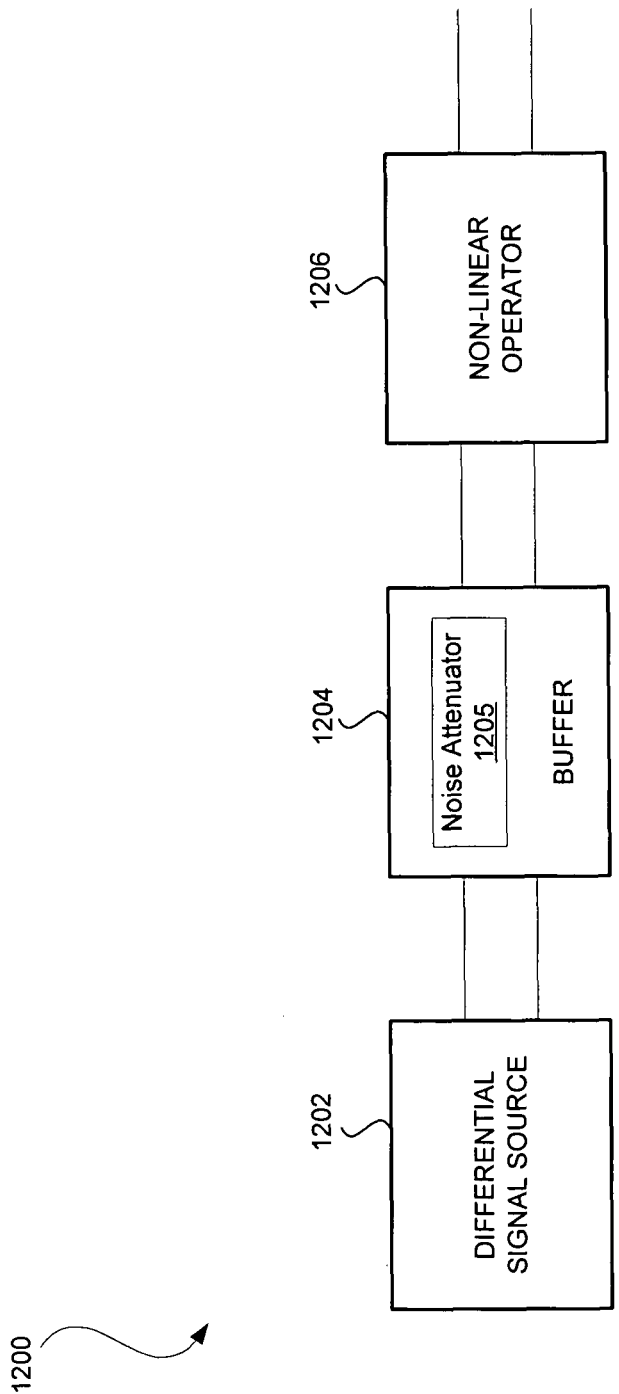
FIG. 12 is a block diagram illustrating a circuit implementing a differential signal source in combination with a noise attenuator in accordance with an embodiment of the present invention.

FIG. 12 is a block diagram illustrating a circuit 1200 implementing a differential signal source in combination with a noise attenuator in accordance with an embodiment of the present invention. The circuit 1200 may comprise, for example, a differential signal source 1202, a differential buffer 1204, and a differential operator 1206 (e.g., a differential, non-linear operator). The buffer 1204 may comprise, for example, a noise attenuator 1205, which may be implemented, at least in part, within the buffer 1204. The differential signal source 1202 may comprise, for example, a differential oscillator. In operation, the differential signal source 1202 may generate a signal which can be buffered within the buffer 1204. While the generated signal is buffered within the buffer 1204, it may also be attenuated by the noise attenuator 1205. For example, the noise attenuator 1205 may selectively attenuate one or more harmonics of the generated signal. After the signal is buffered and attenuated, it may be communicated to a non-linear operator 1206.

Although illustrated as a differential signal, the present invention also contemplates other types of multiple-ended signals such as, for example, quadrature signals. The multiple-ended signal generator may also support a variety of different modulation schemes.

Figure 13:
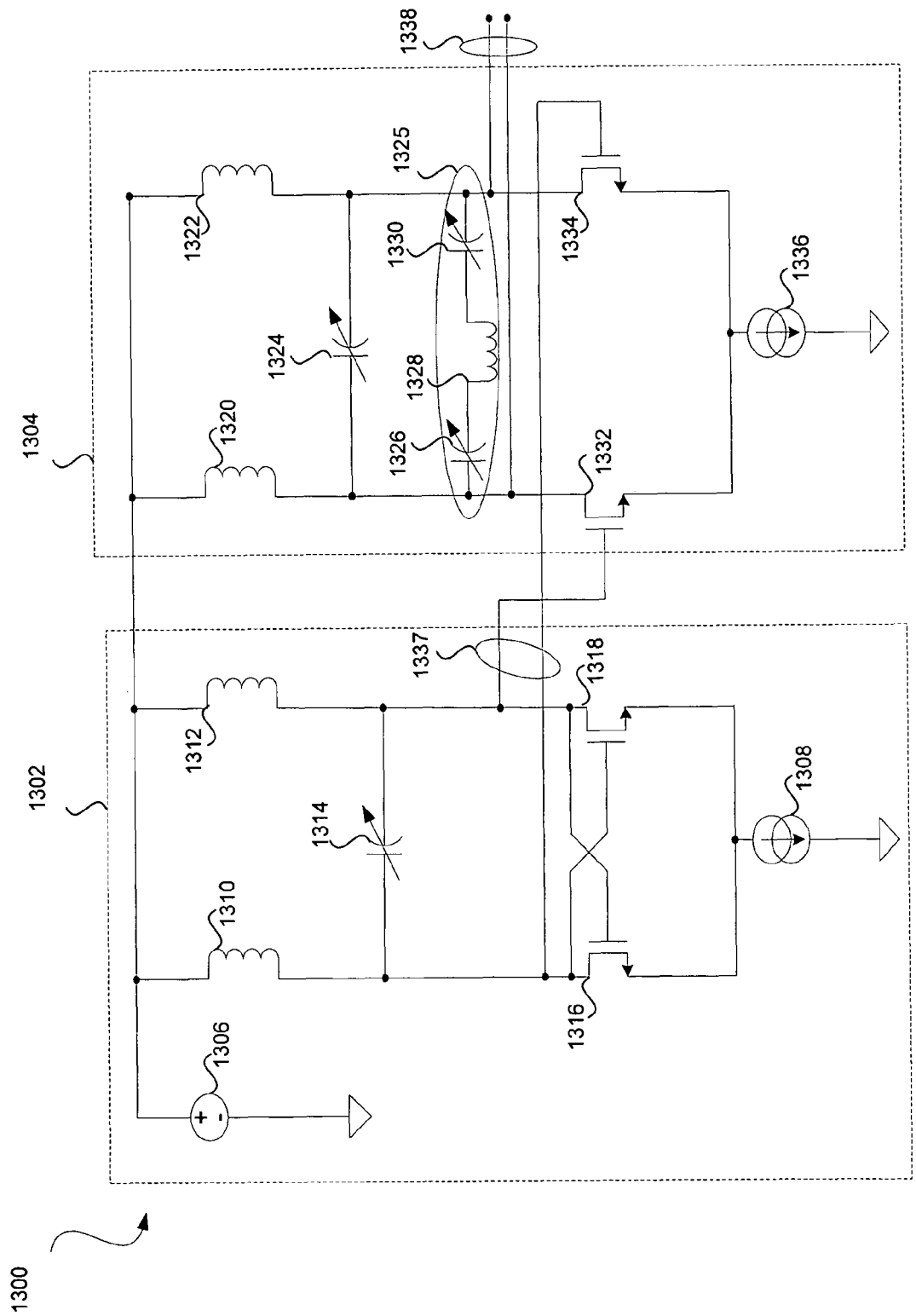
FIG. 13 is an electrical diagram of a circuit implementing a differential output signal generator in combination with a buffer with noise reducing functionality in accordance with an embodiment of the present invention.

FIG. 13 is an electrical diagram of a circuit 1300 implementing a differential output signal generator in combination with a buffer with noise reducing functionality in accordance with an embodiment of the present invention. The circuit 1300 may comprise, for example, a differential signal generator 1302 coupled to a buffer 1304.

The differential signal generator 1302 may comprise, for example, a voltage source 1306 (e.g., a DC voltage supply), inductors 1310 and 1312, a variable capacitor 1314, transistors 1316 and 1318, and a current source 1308. The transistors 1316 and 1318 may form a differential pair of transistors. Although the transistors in FIG. 13 are illustrated as FETs, the present invention contemplates using any type of transistor or amplifier. The transistors 1316 and 1318 may be connected in a feedback configuration. An output (e.g., a drain terminal) of transistor 1316 may be connected to an input (e.g., a gate terminal) of transistor 1318. An output (e.g., a drain terminal) of transistor 1318 may be connected to an input (e.g., a gate terminal) of transistor 1316. The inductors 1310 and 1312, and the variable capacitor 1314 may act as a tuning circuit for the positive feedback loop created by the transistors 1316 and 1318. The inductors 1310 and 1312 and the variable capacitor 1314 may be selected so as to tune the positive feedback loop created by the transistors 1316 and 1318 and to generate a differential signal with a selected main frequency $f_0$ at the differential output (e.g., drain terminals of transistors 1316 and 1318). Thus, the differential signal generated at the differential output of the transistors 1316 and 1318 may be further tuned by the tuning circuit and, in particular, by adjusting the variable capacitor 1314.

The differential output of the transistors 1316 and 1318 may also form the differential output 1337 of the differential signal generator 1302. Tuned at a selected main frequency $f_0$ and generated at the drain terminals of the transistors 1316 and 1318, the differential signal may also be generated at the differential output 1337 of the differential signal generator 1302. The differential output 1337 of the differential signal generator 1302 may be connected to a differential input of the buffer 1304. The buffer 1304 may comprise, for example, inductors 1320 and 1322; a variable capacitor 1324; a harmonic trap comprising, for example, variable capacitors 1326 and 1330 and an inductor 1328; and transistors 1332 and 1334 connected to a current source 1326. The transistors 1332 and 1334 may form a differential pair of transistors.

The differential output signal from the differential output 1337 may be received by the buffer 1304 via a differential input comprising, for example, gate terminals of the transistors 1332 and 1334. A tuning circuit within the buffer 1304 may comprise the inductors 1320 and 1322 and the variable capacitor 1324. The variable capacitor 1324 may be tuned so that the buffer 1304 passes and optionally amplifies the signal with a main frequency $f_0$ generated by the differential signal generator 1302. A harmonic trap may be implemented within the buffer 1304 so that the buffer 1304 further reduces the noise characteristics of the incoming signal by attenuating a selected harmonic frequency or selected harmonic frequencies of the generated signal. For example, the buffer 1304 may comprise a series trap 1325 which comprises variable capacitors 1326 and 1330 and inductor 1328. The series trap 1325 may be connected across the drains of the transistors 1332 and 1334 (e.g., the differential output 1338 of the buffer 1304).

The differential signal generator 1302 may be tuned to generate a signal at a particular main frequency $f_0$. The tuning of the differential signal generator 1302 may be accomplished by choosing appropriate component values for inductors 1310 and 1312 and capacitor 1314 and adjusting the value of the variable capacitor 1314. The series harmonic trap 1325 may be tuned by adjusting the value of the variable capacitors 1326 and 1330 so that the series harmonic trap 1325 attenuates the selected harmonic frequency or harmonic frequencies of the main frequency $f_0$. For example, the series harmonic trap 1325 may be designed to attenuate the second harmonic frequency $2f_0$. The variable capacitor 1324 of the buffer stage tuning circuit may be tuned by taking into account any load that may be contributed from the series harmonic trap 1324 as well as any load contributed by any external load connected to the differential output 1338 of the buffer 1304. When properly tuned, the buffer 1304 may effectively pass and optionally amplify any input signal at the main frequency $f_0$ to the differential output 1338 of the buffer 1304, thereby buffering the input signal.

Noise attenuating techniques in accordance with embodiments of the present invention may be applied at different stages within a circuit. Thus, a noise attenuator comprising one or more harmonic traps may be applied prior to, between and/or after any non-linear operations. In one embodiment according to the present invention, a noise attenuator may be repeated anywhere within a circuit after an element that contributes a noise floor to a received signal. Additionally, noise attenuating techniques in accordance with the invention may be utilized by various circuits comprising an oscillator. Such circuits comprising an oscillator may be utilized by a transmitter, a receiver, a transceiver, a synthesizer, and a data acquisition system, for example.

Some embodiments according to the present invention may relate to reducing phase noise in RF transceivers, for example. However, the present invention need not be so limited. For example, systems (e.g., devices, circuits, integrated chips, etc.) that would benefit from reduced phase noise and/or other types of noise (e.g., thermal noise), may utilize an embodiment of the present invention.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for reducing phase noise, comprising:
generating, in a transmitter, a local oscillator (LO) differential signal at a particular frequency, said LO differential signal being associated with a LO harmonic frequency signal disposed at a LO harmonic frequency;
selecting, utilizing a harmonic trap in a differential buffer, said harmonic trap disposed at an output of said LO differential signal of said transmitter, frequency content disposed in a region around said LO harmonic frequency; and
attenuating, in said transmitter, said selected frequency content disposed in said region around said LO harmonic frequency.

2. The method of claim 1, comprising:
associating said LO differential signal with a second LO harmonic frequency signal disposed at a second LO harmonic frequency; and
selectively attenuating frequency content disposed in a second region around said second LO harmonic frequency.

3. The method of claim 1, comprising:
applying at least one non-linear operation to said LO differential signal to generate an applied signal; and
transmitting said applied signal.

4. The method of claim 3, wherein applying at least one non-linear operation to said LO differential signal comprises dividing said LO differential signal.

5. The method of claim 3, wherein applying at least one non-linear operation to said LO differential signal comprises mixing said LO differential signal with a reference signal.

6. The method of claim 3, wherein applying at least one non-linear operation to said LO differential signal comprises amplifying said LO differential signal.

7. The method of claim 1, wherein said LO differential signal is generated by at least one of: a fixed frequency oscillator, a voltage controlled oscillator, and a current controlled oscillator.

8. The method of claim 1, wherein said frequency content is selectively attenuated by at least one attenuating circuit.

9. The method of claim 8, wherein said at least one attenuating circuit comprises at least one of: an integrated component and a discrete component.

10. The method of claim 8, wherein said at least one attenuating circuit comprises at least one harmonic trap.

11. The method of claim 1, comprising:
buffering said LO differential signal prior to selectively attenuating the frequency content.

12. The method of claim 11, wherein said buffering is performed by a buffer.

13. The method of claim 12, wherein said selective attenuating of the frequency content is performed within said buffer.

14. The method of claim 1, wherein said LO differential signal comprises a quadrature signal.

15. The method of claim 1, wherein said selective attenuating comprises canceling frequency content disposed in said region around said LO harmonic frequency.

16. The method of claim 15, wherein said canceling of said frequency content disposed in said region around the LO harmonic frequency, comprises canceling frequency content disposed only at said LO harmonic frequency.

17. The method of claim 1, wherein said selective attenuating comprises notching frequency content disposed in said region around said LO harmonic frequency.

18. The method of claim 17, wherein said notching frequency content comprises notching frequency content disposed only at said LO harmonic frequency.

19. The method of claim 1, wherein said selective attenuating comprises bandstopping frequency content disposed in said region around said LO harmonic frequency.

20. A circuit for reducing phase noise, comprising:
a signal generator in a transmitter, said signal generator generates a local oscillator (LO) differential signal at a particular frequency, said LO differential signal being associated with a LO harmonic frequency signal disposed at a LO harmonic frequency; and
an attenuating circuit in said transmitter, said attenuating circuit selects, utilizing a harmonic trap in a differential buffer, said harmonic trap disposed at an output of said LO differential signal of said transmitter, frequency content disposed in a region around the LO harmonic frequency and attenuates said selected frequency content disposed in said region around the LO harmonic frequency.

21. The circuit of claim 20, comprising:
a buffer for buffering said LO differential signal, said buffer being coupled to said signal generator.

22. The circuit of claim 21, wherein said attenuating circuit is part of said buffer.

23. The circuit of claim 20, comprising:
a non-linear operation circuit that applies at least one non-linear operation to said LO differential signal to obtain an outgoing signal; and
a transmitting circuit for transmitting said outgoing signal.

24. The circuit of claim 23, wherein said transmitting circuit comprises an antenna.

25. The circuit of claim 23, wherein said non-linear operation circuit comprises a divider that divides said LO differential signal.

26. The circuit of claim 23, wherein said non-linear operation circuit comprises a mixer that mixes said LO differential signal with a reference signal.

27. The circuit of claim 23, wherein said non-linear operation circuit comprises an amplifier that amplifies said LO differential signal.

28. The circuit of claim 20, wherein said signal generator comprises at least one of: a fixed frequency oscillator, a voltage controlled oscillator, and a current controlled oscillator.

29. The circuit of claim 20, wherein said attenuating circuit comprises at least one of: an integrated component and a discrete component.

30. The circuit of claim 29, wherein said attenuating circuit comprises at least one harmonic trap.

31. A system for reducing phase noise, comprising:
a signal generator in a transmitter, said signal generator generates a local oscillator (LO) differential signal at a particular frequency, the LO differential signal being associated with a LO harmonic frequency signal disposed at a LO harmonic frequency; and
a buffer that buffers the LO differential signal, the buffer adapted to select, utilizing a harmonic trap in said buffer, said harmonic trap disposed at an output of said LO differential signal of said transmitter, frequency content disposed in a region around the LO harmonic frequency and attenuate said selected frequency content disposed in said region around the LO harmonic frequency.

32. The system of claim 31, wherein said LO differential signal comprises a quadrature signal.

33. The system of claim 31, wherein said signal generator comprises a differential signal generator.

34. The system of claim 33, wherein said buffer comprises a differential pair of transistors, said differential pair of transistors being adapted to receive said LO differential signal.

35. The system of claim 31, wherein said buffer comprises a harmonic trap, said harmonic trap being adapted to attenuate said frequency content disposed in said region around said LO harmonic frequency.

36. The system of claim 35, wherein said harmonic trap is disposed across a differential output of said buffer.

37. The system of claim 31, wherein said buffer is adapted to band stop said frequency content disposed in said region around the LO harmonic frequency.

38. The system of claim 31, wherein said buffer is adapted to notch said frequency content disposed only at approximately said LO harmonic frequency.

* * * * *

UNITED STATES PATENT AND TRADEMARK OFFICE
CERTIFICATE OF CORRECTION

Page 1 of 1

| | |
|---|---|
| PATENT NO. | : 7,933,555 B2 |
| APPLICATION NO. | : 10/813486 |
| DATED | : April 26, 2011 |
| INVENTOR(S) | : Moloudi |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1008 days.

Signed and Sealed this
First Day of November, 2011

David J. Kappos
*Director of the United States Patent and Trademark Office*